US011210492B2

(12) United States Patent
Yang et al.

(10) Patent No.: US 11,210,492 B2
(45) Date of Patent: Dec. 28, 2021

(54) OLED DISPLAY PANEL, DRIVING METHOD THEREFOR, AND DISPLAY DEVICE

(71) Applicant: BOE Technology Group Co., Ltd., Beijing (CN)

(72) Inventors: Shengji Yang, Beijing (CN); Xue Dong, Beijing (CN); Xiaochuan Chen, Beijing (CN); Hui Wang, Beijing (CN); Pengcheng Lu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/755,966

(22) PCT Filed: Jun. 27, 2019

(86) PCT No.: PCT/CN2019/093370
§ 371 (c)(1),
(2) Date: Apr. 14, 2020

(87) PCT Pub. No.: WO2020/001558
PCT Pub. Date: Jan. 2, 2020

(65) Prior Publication Data
US 2020/0293739 A1  Sep. 17, 2020

(30) Foreign Application Priority Data
Jun. 29, 2018  (CN) .......................... 201810716517.9

(51) Int. Cl.
*G06K 9/00* (2006.01)
*G06K 9/20* (2006.01)
(Continued)

(52) U.S. Cl.
CPC ......... *G06K 9/0004* (2013.01); *G06K 9/2027* (2013.01); *G09G 3/3266* (2013.01);
(Continued)

(58) Field of Classification Search
CPC .............................. G06K 9/0004; G06F 3/042
See application file for complete search history.

(56) References Cited

U.S. PATENT DOCUMENTS

2007/0253505 A1  11/2007  Kostanic
2010/0315583 A1  12/2010  Lin et al.
(Continued)

FOREIGN PATENT DOCUMENTS

| CN | 101872096 A | 10/2010 |
| CN | 105956584 A | 9/2016 |

(Continued)

OTHER PUBLICATIONS

Office Action for corresponding Chinese Application 201810716517.9 dated Mar. 19, 2020.
(Continued)

*Primary Examiner* — Yuzhen Shen
(74) *Attorney, Agent, or Firm* — Arent Fox LLP; Michael Fainberg

(57) ABSTRACT

Disclosed in the present disclosure are an OLED display panel, a driving method therefor and a display device. A first light-blocking layer is disposed between a photosensitive unit and an organic electroluminescent structure, and the first light-blocking layer at least has a hollow area corresponding to a fingerprint identification area. When a finger touches a screen, the lights emitted by the organic electroluminescent structure are reflected by the finger to irradiate the photosensitive unit through small holes, such that fingerprint information of the finger is detected due to the brightness differences among the lights reflected by ridges and valleys of the finger. The small holes in the hollow area can function to improve the light intensity convergence, thus increasing the sensitivity to finger touches to the greatest extent.

16 Claims, 9 Drawing Sheets

(51) Int. Cl.
  *G09G 3/3266* (2016.01)
  *H01L 27/32* (2006.01)
  *H01L 27/146* (2006.01)

(52) U.S. Cl.
  CPC ...... *H01L 27/3234* (2013.01); *H01L 27/3246* (2013.01); *H01L 27/3272* (2013.01); *H01L 27/3276* (2013.01); *G09G 2300/0426* (2013.01); *G09G 2310/0286* (2013.01); *G09G 2360/14* (2013.01); *H01L 27/14678* (2013.01)

(56) References Cited

U.S. PATENT DOCUMENTS

| | | | |
|---|---|---|---|
| 2013/0278568 A1 | 10/2013 | Lasiter et al. | |
| 2014/0022426 A1* | 1/2014 | Minami | H04N 5/3355 348/294 |
| 2016/0141352 A1* | 5/2016 | Sung | G11C 19/287 257/40 |
| 2016/0266695 A1* | 9/2016 | Bae | G06F 3/04166 |
| 2017/0124967 A1 | 5/2017 | Shima et al. | |
| 2018/0089491 A1* | 3/2018 | Kim | G06K 9/00912 |
| 2018/0129852 A1 | 5/2018 | Zeng et al. | |
| 2018/0150670 A1* | 5/2018 | Jang | G06F 3/0488 |
| 2018/0225497 A1 | 8/2018 | Li et al. | |
| 2019/0130155 A1* | 5/2019 | Park | G09G 3/3208 |
| 2019/0156097 A1* | 5/2019 | Liu | G06K 9/0004 |
| 2019/0187756 A1 | 6/2019 | Sun | |
| 2019/0251324 A1* | 8/2019 | Yim | G06F 21/602 |
| 2019/0332844 A1* | 10/2019 | Liu | H01L 27/14678 |
| 2019/0354226 A1* | 11/2019 | Choi | G06F 1/3265 |
| 2020/0019804 A1* | 1/2020 | Kim | G06K 9/00912 |
| 2020/0293739 A1 | 9/2020 | Yang et al. | |

FOREIGN PATENT DOCUMENTS

| | | | | |
|---|---|---|---|---|
| CN | 106298859 A | * | 1/2017 | ........... G06F 3/0412 |
| CN | 106298859 A | | 1/2017 | |
| CN | 106898315 A | | 6/2017 | |
| CN | 106940488 A | | 7/2017 | |
| CN | 106981503 A | | 7/2017 | |
| CN | 107066976 A | | 8/2017 | |
| CN | 108073900 A | | 5/2018 | |
| CN | 108899344 A | | 11/2018 | |

OTHER PUBLICATIONS

Office Action for corresponding Chinese Application 201810716517.9 dated Sep. 24, 2020.

* cited by examiner

OLED DISPLAY PANEL, DRIVING METHOD THEREFOR, AND DISPLAY DEVICE

CROSS REFERENCE TO RELATED APPLICATIONS

This application is a National Stage of International Application No. PCT/CN2019/093370, filed Jun. 27, 2019, which claims the priority to the Chinese Patent Application filed with Chinese Patent Office on 29 Jun. 2018 with No. 201810716517.9 and entitled "OLED DISPLAY PANEL, DRIVING METHOD THEREFOR AND DISPLAY DEVICE", the entire contents of which are incorporated herein by reference.

FIELD

The present disclosure relates to the field of display and in particular to an OLED display panel, a driving method therefor and a display device.

BACKGROUND

With the coming of information age, people pay more and more attention to information security, fingerprints are widely applied to security encryption and information identification due to the uniqueness of information contained in the fingerprints, and therefore, the development of a fingerprint identification technology is also widely concerned by people.

In the related art, fingerprint identification in a display device is mainly realized in a display area by additionally increasing infrared luminous subpixels and fingerprint photosensitive devices on the basis of original pixels, however, in the above-mentioned identification way, lights emitted by the infrared luminous subpixels may be received by a plurality of fingerprint photosensitive devices within a very wide range after being reflected by a fingerprint, and the identification sensitivities of ridges and valleys of the finger are not high.

SUMMARY

Embodiments of the present disclosure provide an OLED display panel, a driving method therefor and a display device so as to improve the sensitivity of fingerprint identification.

An embodiment of the present disclosure provides an OLED display panel, including: a display area, the display area being internally provided with a plurality of organic electroluminescent structures arranged in a matrix; a fingerprint identification area, the fingerprint identification area being located in the display area, the fingerprint identification area being also internally provided with a plurality of photosensitive elements, and the photosensitive elements being located at the backlight sides of the organic electroluminescent structures.

The display panel further includes: a first light-blocking layer, the first light-blocking layer being located between each of the photosensitive elements and each of the organic electroluminescent structures, and the first light-blocking layer being at least provided with a hollow area corresponding to the fingerprint identification area, where the hollow area of the first light-blocking layer is provided with a plurality of via holes passing through the first light-blocking layer, and the via holes are located in an area corresponding to a gap among the adjacent organic electroluminescent structures.

Optionally, in the OLED display panel provided by the embodiment of the present disclosure, the first light-blocking layer is provided with a hollow area corresponding to the display area.

Optionally, the sizes of the via holes are smaller than or equal to those of the organic electroluminescent structures.

Optionally, orthographic projections of the photosensitive elements on the first light-blocking layer cover an area where at least one of the via holes is located.

Optionally, a pixel defining layer is further disposed between every two adjacent organic electroluminescent structures, and the pixel defining layer is provided with corresponding openings in positions corresponding to the via holes.

Optionally, in the OLED display panel provided by the embodiment of the present disclosure, the display area is further provided with a pixel circuit electrically connected with each of the organic electroluminescent structures; and the first light-blocking layer is located between the pixel circuit and each of the organic electroluminescent structures.

Optionally, the organic electroluminescent structures include an anode layer; the pixel circuit includes a thin film transistor, the thin film transistor includes an active layer and a source and drain electrode layer located at the side, facing the first light-blocking layer, of the active layer; and the first light-blocking layer is located between the source and drain electrode layer and the anode layer.

Optionally, in the OLED display panel provided by the embodiment of the present disclosure, the display area is further provided with a connecting electrode disposed on the same layer with the first light-blocking layer and insulated from the first light-blocking layer, and the pixel circuit is connected with the organic electroluminescent structures via the connecting electrode.

Optionally, in the OLED display panel provided by the embodiment of the present disclosure, the display area is further provided with a signal line, and the first light-blocking layer and the signal line are not provided with overlapping areas in a direction perpendicular to a screen of the display panel.

Optionally, the signal line includes one or a combination of the followings: a data line; a scanning line; or a power line.

Optionally, in the OLED display panel provided by the embodiment of the present disclosure, the display area is further provided with a second light-blocking layer disposed around the plurality of photosensitive elements.

Optionally, in the OLED display panel provided by the embodiment of the present disclosure, the display area is further provided with a base substrate; the organic electroluminescent structures and the first light-blocking layer are located at one side of the base substrate; and the photosensitive elements and the second light-blocking layer are located at the other side of the base substrate.

Optionally, the OLED display panel provided by the embodiment of the present disclosure further includes a gate driving circuit.

The gate driving circuit includes a plurality of shift register elements corresponding to the organic electroluminescent structures in each row; the shift register elements are configured to provide a light emitting control signal to the pixel circuit electrically connected with the organic electroluminescent structures in the corresponding row.

The shift register elements, corresponding to the organic electroluminescent structures in the fingerprint identification area, in the gate driving circuit are first shift register elements, and other shift register elements are second shift register elements; and each of the first shift register elements is electrically connected with a first power line, and each of the second shift register elements is electrically connected with a second power line.

Optionally, in the OLED display panel provided by the embodiment of the present disclosure, the photosensitive elements include photodiodes.

Optionally, the OLED display panel provided by the embodiment of the present disclosure further includes a signal reading element electrically connected with each of the photodiodes, where the signal reading element includes a first transistor, a second transistor, a third transistor, a first capacitor, a second capacitor, an operational amplifier and a control switch.

The gate of the first transistor is electrically connected with a reset signal end, the first electrode of the first transistor is electrically connected with a common voltage signal end, and the second electrode of the first transistor is electrically connected with one end of each of the photodiodes and the gate of the second transistor respectively.

The first electrode of the second transistor is electrically connected with a power voltage end, and the second electrode of the second transistor is electrically connected with the first electrode of the third transistor.

The gate of the third transistor is electrically connected with a control end, and the second electrode of the third transistor is electrically connected with the negative input end of the operational amplifier.

The positive input end of the operational amplifier is electrically connected with a reference signal end, and the output end of the operational amplifier is configured to read a signal.

The first capacitor is electrically connected between the gate of the second transistor and the common voltage signal end.

The second capacitor is electrically connected between the negative input end and the output end of the operational amplifier.

The control switch is connected in parallel at two ends of the second capacitor.

Accordingly, an embodiment of the present disclosure further provides a display device including any one of the above-mentioned OLED display panel provided by the embodiment of the present disclosure.

Accordingly, an embodiment of the present disclosure further provides a driving method for driving the above-mentioned OLED display panel, display and fingerprint identification are driven in a time-sharing way within one period.

At a display stage, the organic electroluminescent structures are driven row by row to emit lights.

At a fingerprint identification stage, the organic electroluminescent structures in the fingerprint identification area are only driven to emit lights, and fingerprint identification is performed according to output signals of the photosensitive elements.

Optionally, in the OLED display panel provided by the embodiment of the present disclosure, at the fingerprint identification stage, the organic electroluminescent structures, emitting green lights, in the fingerprint identification area are only driven to emit lights.

Optionally, at the fingerprint identification stage, all areas except the fingerprint identification area are black-frame-inserted.

The present disclosure has the beneficial effects as follows: according to the above-mentioned OLED display panel, the driving method therefor and the display device provided by the embodiments of the present disclosure, the first light-blocking layer is disposed between each of the photosensitive elements and each of the organic electroluminescent structures, and the first light-blocking layer is at least provided with the hollow area corresponding to the fingerprint identification area. When a finger touches a screen, lights emitted by the organic electroluminescent structures are reflected by the finger to irradiate the photosensitive elements through small holes, such that fingerprint information of the finger is sensed due to brightness differences among the lights reflected by ridges and valleys of the finger. The small holes in the hollow area may function to improve the light intensity convergence, thus increasing the induction sensitivity to finger touching to the greatest extent.

DETAILED DESCRIPTION OF THE EMBODIMENTS

Embodiments of the present disclosure provide an Organic Light-Emitting Diode (OLED) display panel, a driving method therefor and a display device. To make the objectives, technical solutions and advantages of the present disclosure clearer, the present disclosure will be further described below in detail in combination with the accompanying drawings. Obviously, the described embodiments are only a part of embodiments of the present disclosure, not all the embodiments. Based on the embodiments in the present disclosure, all other embodiments obtained without creative work of those skilled in the art fall within the protection scope of the present disclosure.

The shape and size of each component in the accompanying drawings are only intended to schematically describe the content of the present disclosure, rather than to reflect a true proportion.

Figure 1:
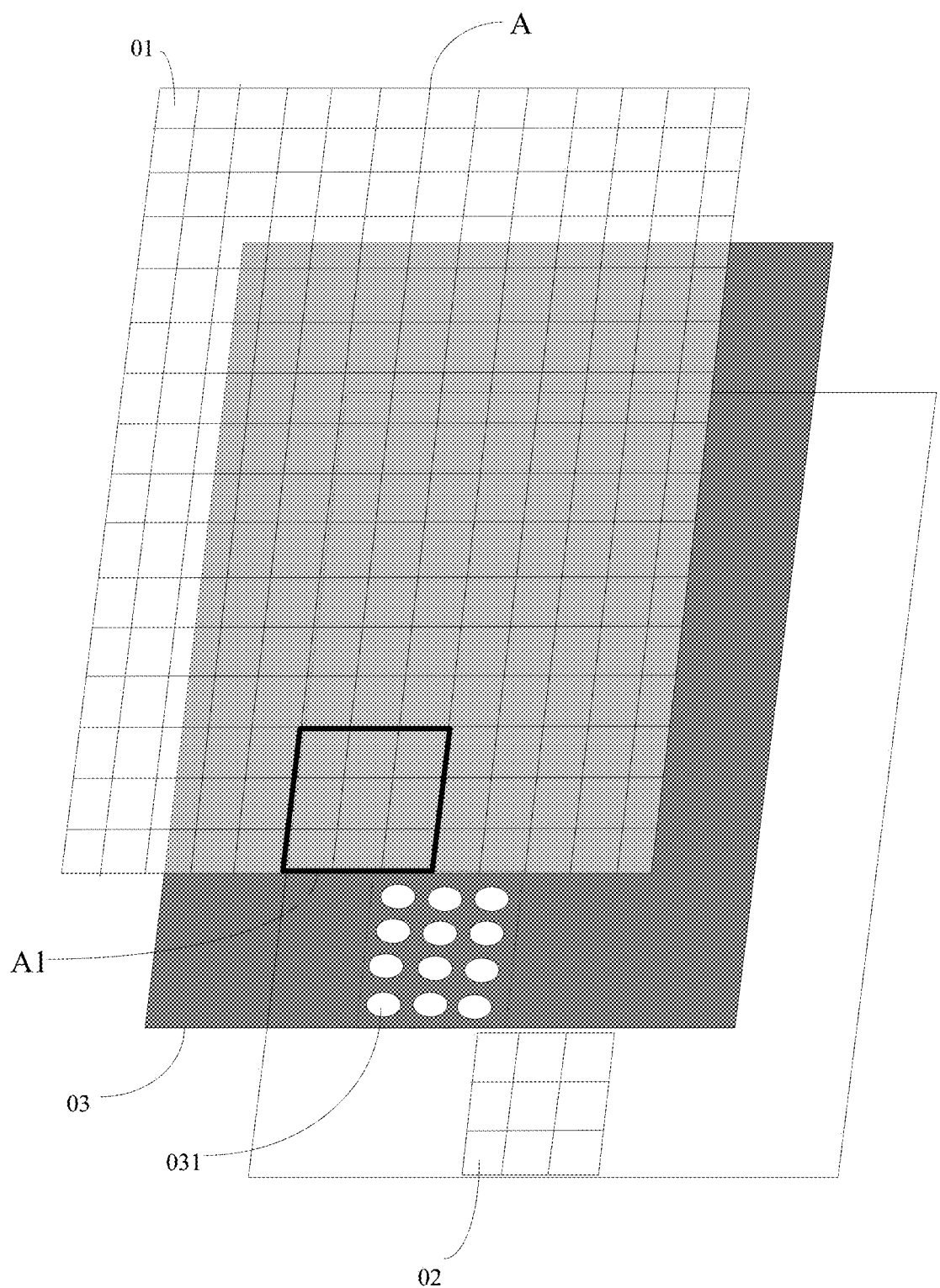
FIG. 1 is a schematic overlooking structural diagram of an OLED display panel provided by an embodiment of the present disclosure.
Figure 2:
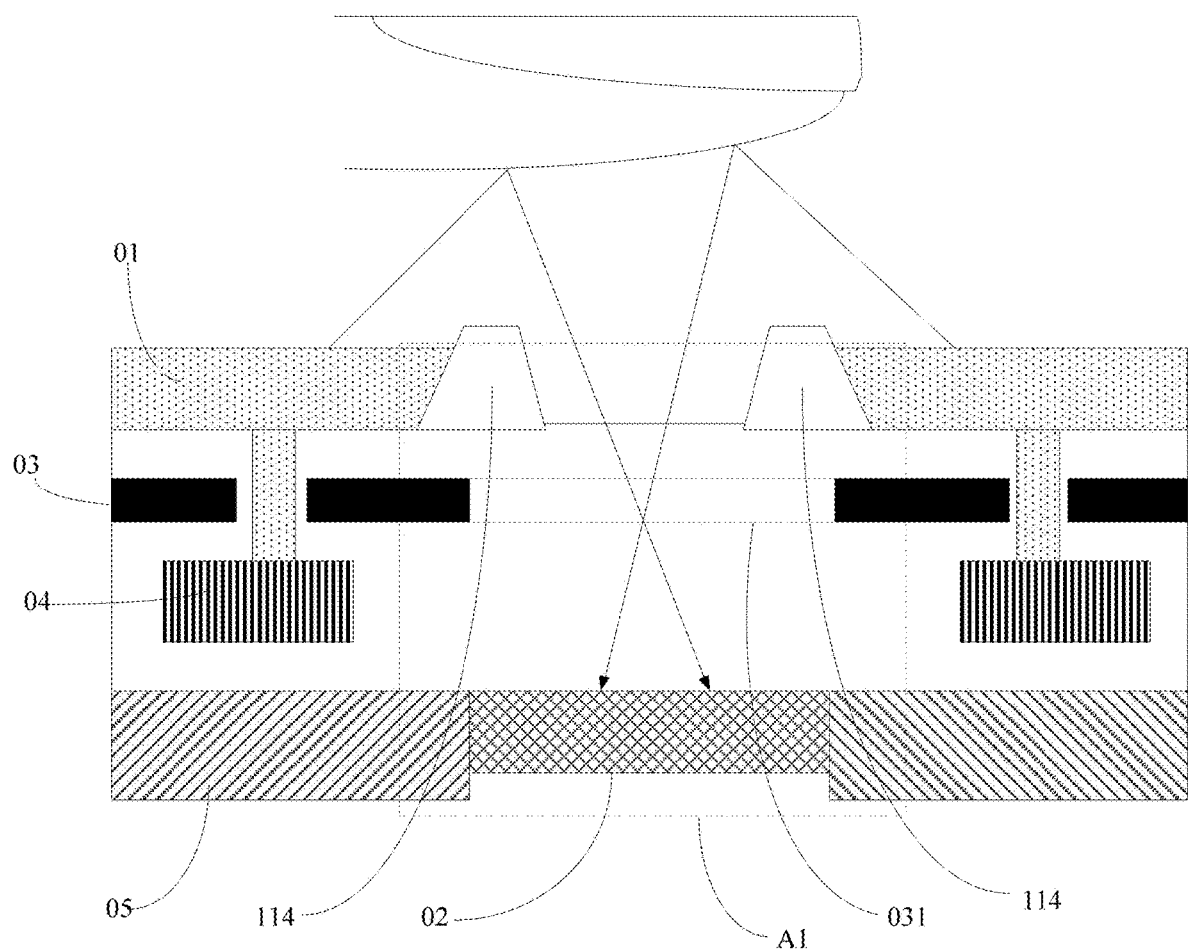
FIG. 2 is a schematic local sectional structural diagram of the OLED display panel provided by the embodiment of the present disclosure.

An embodiment of the present disclosure provides an OLED display panel, as shown in FIG. 1 and FIG. 2, including: a display area A, the display area A being internally provided with a plurality of organic electroluminescent structures 01 arranged in a matrix; a fingerprint identification area A1, the fingerprint identification area A1 being located in the display area A, the fingerprint identification area A1 being also internally provided with a plurality of photosensitive elements 02, and the photosensitive elements 02 being located at the backlight sides of the organic electroluminescent structures 01. The display panel further includes a first light-blocking layer 03, the first light-blocking layer 03 being located between the photosensitive elements 02 and the organic electroluminescent structures 01, and the first light-blocking layer 03 being at least provided with a hollow area corresponding to the fingerprint identification area A1, where the hollow area of the first light-blocking layer 03 is provided with a plurality of via holes 031 passing through the first light-blocking layer 03, as shown in FIG. 2, the via holes 031 are located in an area corresponding to a gap among the adjacent organic electroluminescent structures 01, and in a direction perpendicular to the first light-blocking layer 03, gaps between the via holes 031 and the adjacent organic electroluminescent structures 01 are provided with overlapping areas.

According to the OLED display panel provided by the embodiment of the present disclosure, the first light-blocking layer is disposed between each of the photosensitive elements and each of the organic electroluminescent structures, the first light-blocking layer is at least provided with a hollow area corresponding to the fingerprint identification area, and the via holes are located in an area corresponding to a gap among the adjacent organic electroluminescent structures. When a finger touches a screen, lights emitted by the organic electroluminescent structures are reflected by the finger to irradiate the photosensitive elements through small holes, such that fingerprint information of the finger is sensed due to brightness differences among the lights reflected by ridges and valleys of the finger. The small holes in the hollow area may function to improve the light intensity convergence, thus increasing the induction sensitivity to finger touching to the greatest extent.

Figure 3:
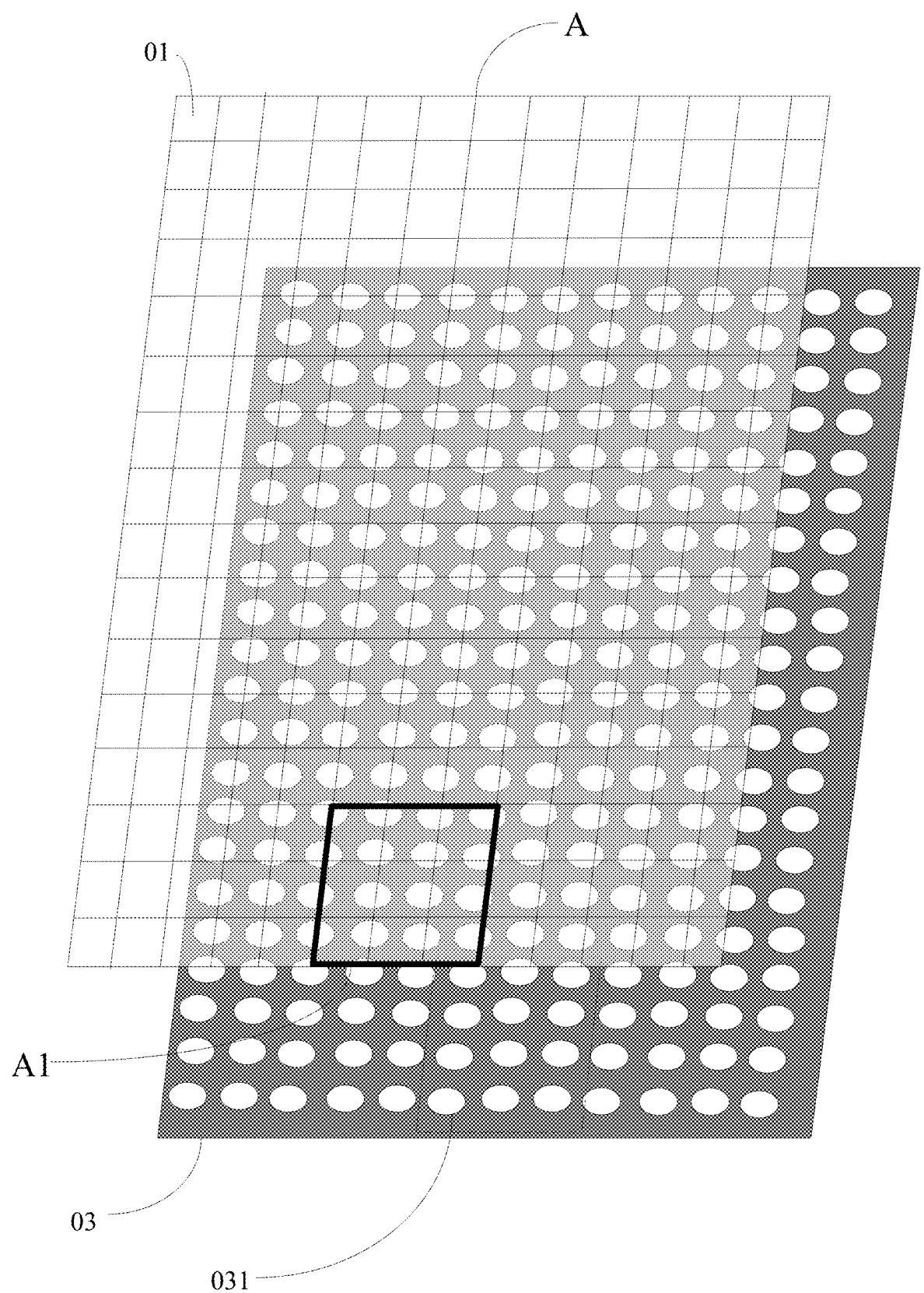
FIG. 3 is a schematic structural diagram of a first light-blocking layer in the OLED display panel provided by the embodiment of the present disclosure.

During specific implementation, when the first light-blocking layer is only provided with a hollow area corresponding to the fingerprint identification area, differences may exist between the fingerprint identification area and other display areas during display. Therefore, optionally, in the OLED display panel provided by the embodiment of the present disclosure, as shown in FIG. 3, the first light-blocking layer 03 is provided with a hollow area corresponding to the display area A.

During specific implementation, in the OLED display panel provided by the embodiment of the present disclosure, one of the via holes in the hollow area may correspond to one or a plurality of the organic electroluminescent structures, or one of the via holes may correspond to one or a plurality of the photosensitive elements, the sizes of the via holes are set according to identification precision, the higher the precision is, the larger the number of the via holes is, and the smaller the areas of the via holes are, the limitations thereof are omitted herein.

Optionally, the sizes of the via holes 031 are smaller than or equal to those of the organic electroluminescent structures 01. In the embodiment of the present disclosure, the first light-blocking layer is provided with the small holes with the sizes being smaller than or equal to those of the organic electroluminescent structures 01, so that the display panel has relatively high fingerprint identification precision on the premise that the small holes may be fabricated by using a process.

Optionally, orthographic projections of the photosensitive elements 02 on the first light-blocking layer 03 cover an area where at least one of the via holes 031 is located. The precision of general fingerprint identification is lower than that of a pixel, namely the sizes of the photosensitive elements 02 are larger than those of the organic electroluminescent structures 01, and therefore, the plurality of via holes 031 may be formed in a position corresponding to one of the photosensitive elements 02 when the via holes 031 are located among the adjacent organic electroluminescent structures 01.

Optionally, as shown in FIG. 2, a pixel defining layer 114 is further disposed between every two adjacent organic electroluminescent structures 01, and the pixel defining layer 114 is provided with corresponding openings in positions corresponding to the via holes 031. In the embodiment of the present disclosure, the pixel defining layer 114 is further provided with corresponding openings in positions corresponding to the via holes 031, so that the lights blocked by the pixel defining layer 114 may be reduced, and the intensities of the lights emitted into the photosensitive elements 02 may be improved.

Optionally, in the OLED display panel provided by the embodiment of the present disclosure, as shown in FIG. 2, the display area is further provided with a pixel circuit 04 electrically connected with each of the organic electroluminescent structures 01; and the first light-blocking layer 03 is located between the pixel circuit 04 and each of the organic electroluminescent structures 01.

Optionally, the organic electroluminescent structures 01 include an anode layer; the pixel circuit 04 includes a thin film transistor, the thin film transistor includes an active layer and a source and drain electrode layer located at the side, facing the first light-blocking layer 03, of the active layer; and the first light-blocking layer 03 may be specifically located between the source and drain electrode layer and the anode layer.

Optionally, in the OLED display panel provided by the embodiment of the present disclosure, the display area is further provided with a connecting electrode disposed on the same layer with the first light-blocking layer and insulated from the first light-blocking layer, and the pixel circuit is connected with the organic electroluminescent structures via the connecting electrode. In this way, the phenomenon that relatively deep holes are required to be dug when the organic electroluminescent structures are electrically connected with the pixel circuit may be avoided, and the organic electroluminescent structures may be directly and electrically connected with the pixel circuit by virtue of the electric connecting electrode. In addition, the electric connecting electrode is disposed on the same layer with the first light-blocking layer, and patterns of the first light-blocking layer and the electric connecting electrode may be formed by adopting a primary composition process, and no other composition processes are required to be increased.

Optionally, in the OLED display panel provided by the embodiment of the present disclosure, the display area is further provided with a signal line, and the first light-blocking layer and the signal line are not provided with overlapping areas in a direction perpendicular to a screen of the display panel. Namely the first light-blocking layer and the signal line are not provided with enfilade areas, in this way, the first light-blocking layer and the signal line may not form a capacitor, so that loading on the signal line is reduced.

During specific implementation, the signal line includes one or a combination of a data line, a scanning line and a power line, all conductors located in the display area fall within the scope of the signal line, the limitations thereof are omitted therein.

During specific implementation, in the OLED display panel provided by the embodiment of the present disclosure, in order to reduce the loading between the first light-blocking layer and the signal line, the thickness of a film layer between the first light-blocking layer and the signal line may be increased.

Optionally, in the OLED display panel provided by the embodiment of the present disclosure, as shown in FIG. 2, the display area is further provided with a second light-blocking layer 05 disposed around the plurality of photosensitive elements 02. In this way, the phenomenon that the photosensitive elements are affected by lateral lights may be avoided.

Optionally, in the OLED display panel provided by the embodiment of the present disclosure, the display area is further provided with a base substrate; the organic electroluminescent structures and the first light-blocking layer are located at one side of the base substrate; and the photosensitive elements and the second light-blocking layer are located at the other side of the base substrate. In other words, the photosensitive elements are post-positioned on the base substrate. Of course, during specific implementation, the photosensitive elements and the organic electroluminescent structures may be located at the same side of the base substrate, the limitations thereof are omitted herein.

During specific implementation, when the photosensitive elements are post-positioned on the base substrate, generally, the photosensitive elements are firstly formed on a chip, and then, the chip is combined with the base substrate.

During specific implementation, the base substrate may be a flexible base substrate, of course, the base substrate may also be a hard base substrate made of glass and the like, the limitations thereof are omitted herein.

During specific implementation, the pixel circuit generally includes a driving transistor, a switch transistor and the like, and the pixel circuit is electrically connected with the organic electroluminescent structures via the driving transistor. The transistor generally includes a gate, a source electrode, a drain electrode and an active layer. The organic electroluminescent structure generally includes an anode layer, a light emitting layer and a cathode layer which are sequentially superimposed.

Figure 4:
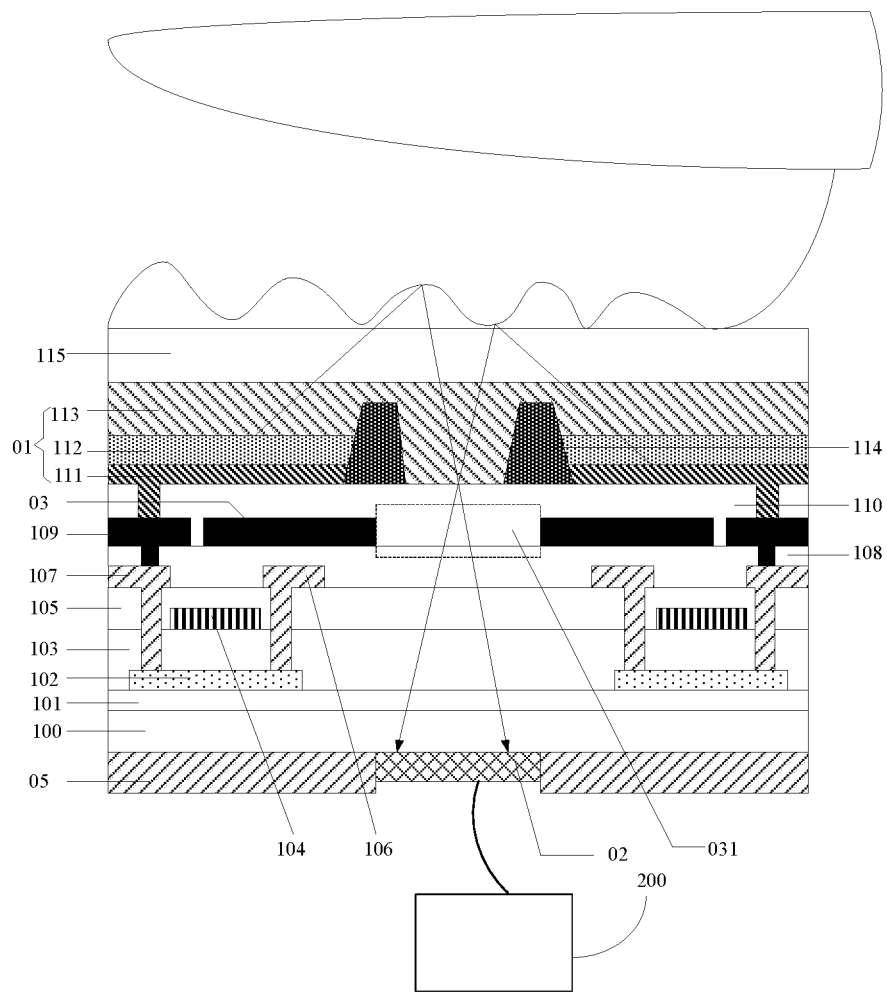
FIG. 4 is a schematic structural diagram of the OLED display panel provided by the embodiment of the present disclosure.

The OLED display panel provided by the embodiment of the present disclosure is described with a specific embodiment below. As shown in FIG. 4, in the OLED display panel, a base substrate 100 is sequentially provided with a buffer layer 101, an active layer 102, a gate insulating layer 103, a gate 104, an interlayer dielectric layer 105, a source electrode 106, a drain electrode 107, a first planarization layer 108, a connecting electrode 109 and a first light-blocking layer 03 disposed on the same layer, a second planarization layer 110, an anode layer 111, a light emitting layer 112, a cathode layer 113, a pixel defining layer 114 and a packaging layer 115.

The other side of the base substrate 100 is provided with a second light-blocking layer 05 and photosensitive elements 02, where an organic electroluminescent structure 01 including the anode layer 111, the light emitting layer 112 and the cathode layer 113 is electrically connected with the drain electrode 107 via the connecting electrode 109, a first light-blocking layer 03 is provided with via holes 031, and lights emitted by the organic electroluminescent structures 01 are reflected by a finger to irradiate the photosensitive elements 02 through the via holes 031, such that fingerprint information of the finger is sensed due to brightness differences among the lights reflected by ridges and valleys of the finger. The via holes 031 may function to improve the light intensity convergence, thus increasing the induction sensitivity to finger touching to the greatest extent. In FIG. 4, the photosensitive elements 02 are post-positioned on the base substrate 100, during specific implementation, generally, the photosensitive elements 02 are firstly formed on a chip 200, and then, the chip 200 is combined with the base substrate 100, where FIG. 4 is schematic by taking one of the photosensitive elements 02 in the chip 200 as an example.

In addition, during specific implementation, the transistor may be of a top-gate-type structure, a bottom-gate-type structure or other structures, the limitations thereof are omitted herein, and FIG. 4 is described with the top-gate-type structure as an example. The OLED display panel may be specifically a top-emission-type OLED display panel, namely displayed lights are emitted upwards, and the anode layer 111 may be specifically a reflective anode. The top-emission-type OLED display panel basically adopts a microcavity structure, and therefore, it is very necessary to form the holes for light convergence in the first light-blocking layer in the present disclosure.

Further, during specific implementation, the transistor may be of a single-gate structure as shown in FIG. 4 and may also be designed to be of a multi-gate structure such as a double-gate structure according to an actual demand, the limitations thereof are omitted herein.

Optionally, in the OLED display panel provided by the embodiment of the present disclosure, the photosensitive elements generally include photodiodes.

Figure 5:
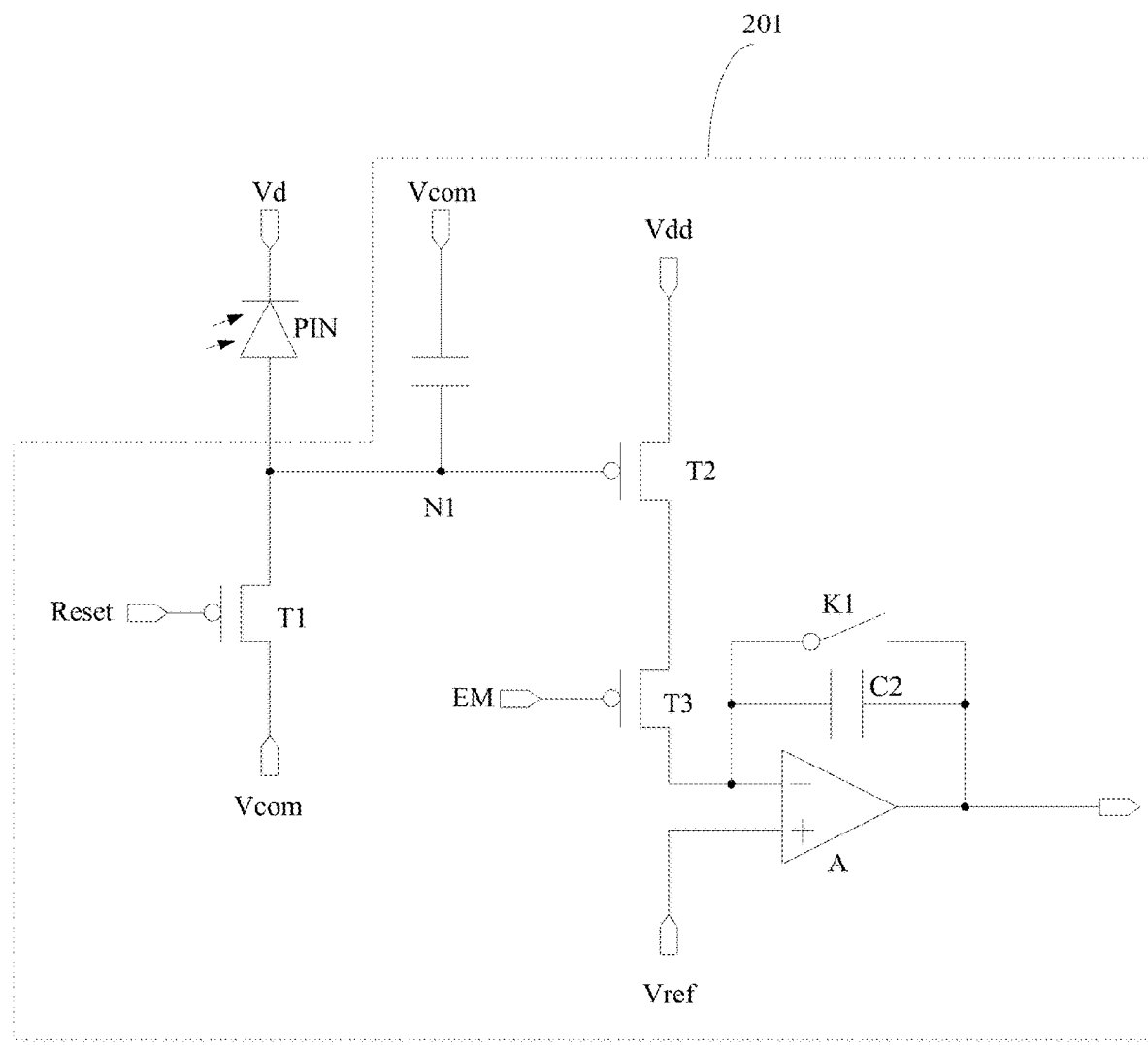
FIG. 5 is a schematic structural diagram of a signal reading element in the OLED display panel provided by the embodiment of the present disclosure.

Optionally, in the OLED display panel provided by the embodiment of the present disclosure, as shown in FIG. 5, the display panel may further include a signal reading element 201 electrically connected with each of the photodiodes PIN, where the signal reading element 201 includes a first transistor T1, a second transistor T2, a third transistor T3, a first capacitor C1, a second capacitor C2, an operational amplifier A and a control switch K1.

The gate of the first transistor T1 is electrically connected with a reset signal end Reset, the first electrode of the first transistor T1 is electrically connected with a common voltage signal end Vcom, and the second electrode of the first transistor T1 is electrically connected with the anode of each of the photodiodes PIN and the gate of the second transistor T2 respectively.

The first electrode of the second transistor T2 is electrically connected with a power voltage end Vdd, and the second electrode of the second transistor T2 is electrically connected with the first electrode of the third transistor T3.

The gate of the third transistor T3 is electrically connected with a control end EM, and the second electrode of the third transistor T3 is electrically connected with the negative input end of the operational amplifier A.

The positive input end of the operational amplifier A is electrically connected with a reference signal end Vref, and the output end of the operational amplifier A is configured to read a signal.

The first capacitor C1 is electrically connected between the gate of the second transistor T2 and the common voltage signal end Vcom.

The second capacitor C2 is electrically connected between the negative input end and the output end of the operational amplifier A.

The control switch K1 is connected in parallel at two ends of the second capacitor C2.

Specifically, the cathodes of the photodiodes PIN are electrically connected with a fixed potential end Vd.

Specifically, in the OLED display panel provided by the embodiment of the present disclosure, fingerprint identification is performed via the signal reading element as shown in FIG. 5, the signal reading element may be disposed on the chip, of course, a part of the transistors may be integrated on the base substrate, the limitations thereof are omitted herein.

Figure 6:
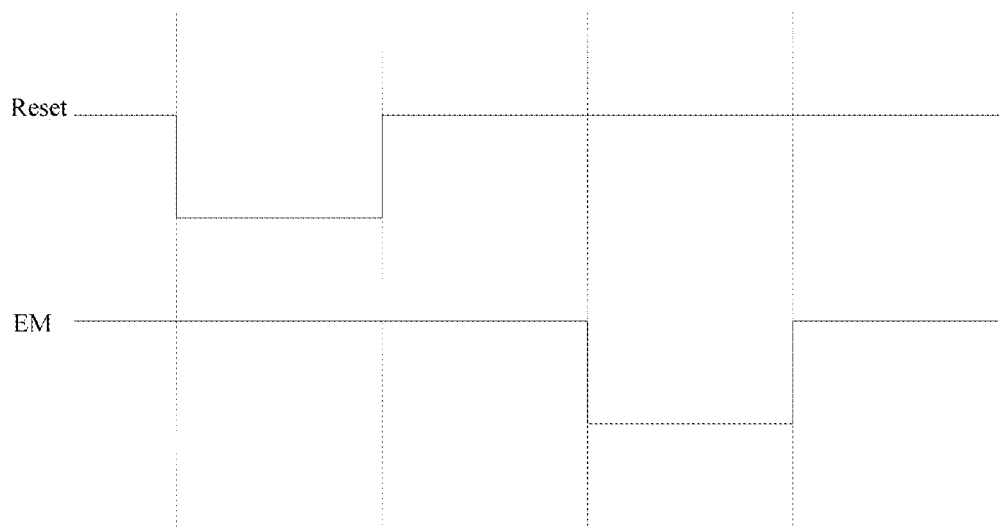
FIG. 6 is a sequence diagram corresponding to the signal reading element as shown in FIG. 5.

Further, a sequence diagram corresponding to the signal reading element as shown in FIG. 5 is shown as FIG. 6, and the specific working principle is that: the reset signal end Reset controls the first transistor T1 to be turned on to reset the potential of a node N1, the photodiodes PIN are reversely connected, so that the higher the intensity of lights received by the photodiodes PIN is, the larger the current generated by the second transistor T2 under the control of the potential of the first node N1 is, and when the control end EM controls the third transistor to be turned on, the current output by the second transistor T2 passes through the third transistor T3 and then is amplified by the operational amplifier A and output, so that ridges or valleys of fingerprints may be judged by reading a signal at the output end of the operational amplifier A.

Of course, during specific implementation, the specific structure of the signal reading element is not limited herein and may also be other structures capable of realizing the above-mentioned signal reading, the limitations thereof are omitted herein.

Figure 7:
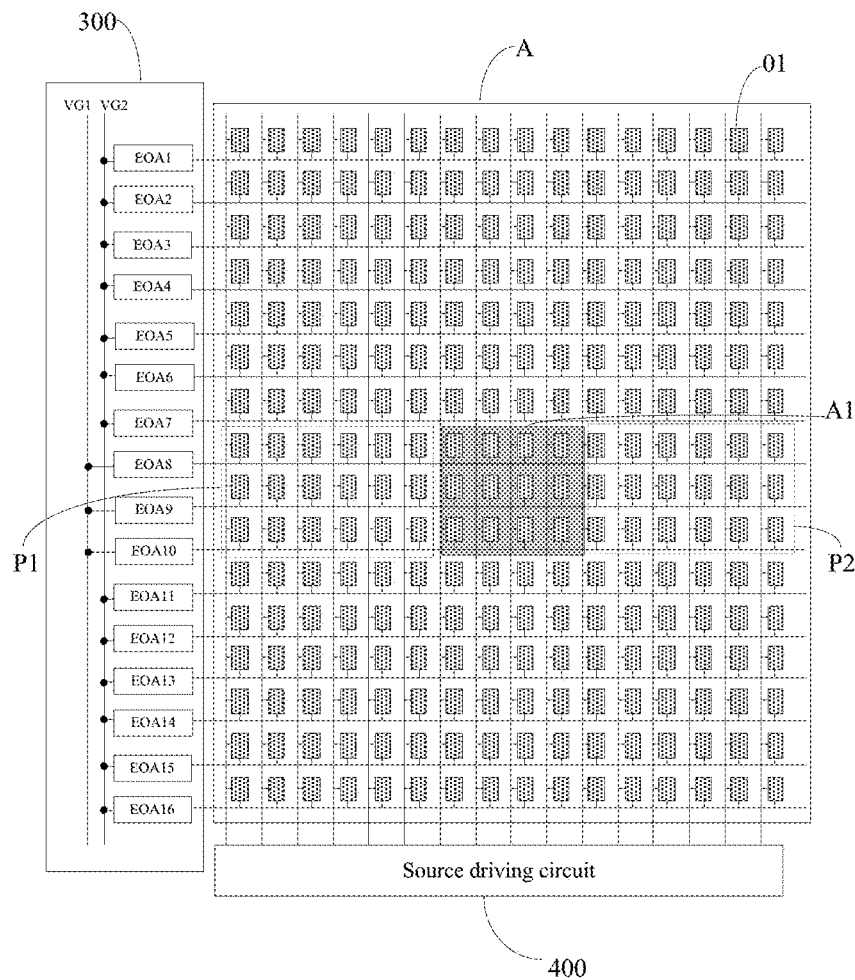
FIG. 7 is a schematic structural diagram of the OLED display panel provided by the embodiment of the present disclosure.

Optionally, the OLED display panel provided by the embodiment of the present disclosure, as shown in FIG. 7, further includes a gate driving circuit 300.

The gate driving circuit 300 includes a plurality of shift register elements EOAn corresponding to the organic electroluminescent structures 01 in each row, where n is equal to 1, 2, 3 . . . N, and FIG. 7 is described with N=17 as an example; the shift register elements EOAn are configured to provide a light emitting control signal to the pixel circuit electrically connected with the organic electroluminescent structures in the corresponding row.

The shift register elements EOA8-EOA10, corresponding to the organic electroluminescent structures 01 in the fingerprint identification area A1, in the gate driving circuit 300 are first shift register elements, and other shift register elements EOA1-EOA7 and EOA11-EOA16 are second shift register elements; and each of the first shift register elements EOA8-EOA10 is electrically connected with a first power line VG1, and each of the second shift register elements EOA1-EOA7 and EOA11-EOA16 is electrically connected with a second power line VG2.

During specific implementation, the potential of the output light emitting control signal is generally controlled by the power line electrically connected with the shift register elements, and the power line generally electrically connected with the shift register elements is configured to transmit a high-potential signal when the effective potential of the light emitting control signal is a high potential (namely the organic electroluminescent structures emit lights when the light emitting control signal is at the high potential); and the power line generally electrically connected with the shift register elements is configured to transmit a low-potential signal when the effective potential of the light emitting control signal is a low potential. With the shift register elements as shown in FIG. 8 as an example, the shift register elements control the potential of the light emitting control signal via the power line VGL.

Figure 8:
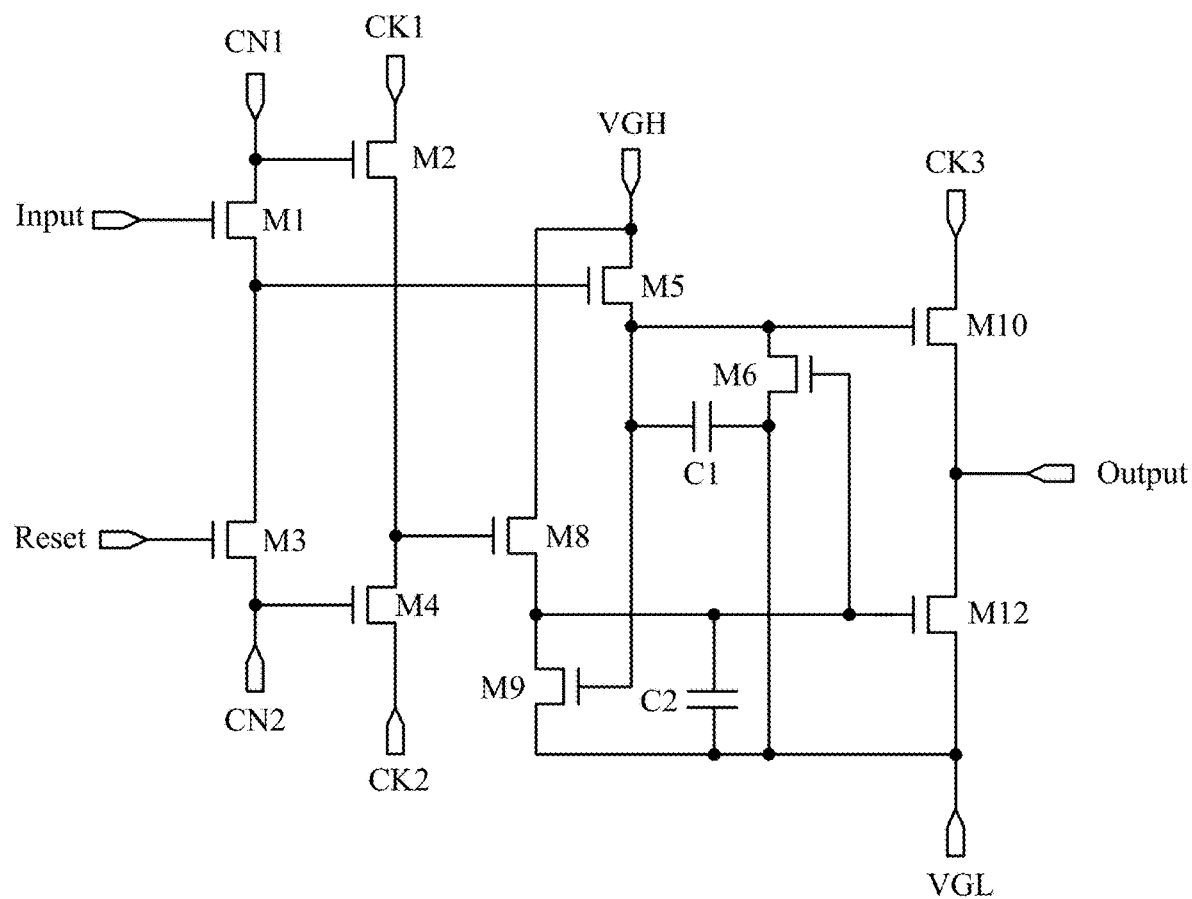
FIG. 8 is a schematic structural diagram of a shift register element provided by an embodiment of the present disclosure.

At present, in an existing gate driving circuit, all the shift register elements are electrically connected with the same power line, similarly, with the shift register elements as shown in FIG. 8 as an example, all the shift register elements in the gate driving circuit are electrically connected with the power line VGL, in this way, regional control may not be realized.

Therefore, in the embodiment of the present disclosure, the first shift register elements in the gate driving circuit are electrically connected with the first power line, the second shift register elements are electrically connected with the second power line, and the organic electroluminescent structures in the fingerprint identification area and the organic electroluminescent structures in other areas may be respectively controlled, so that all non-fingerprint-identification areas in the display area may be black-frame-inserted during fingerprint identification. Namely during fingerprint identification, only the organic electroluminescent structures in the fingerprint identification area emit lights, and all the organic electroluminescent structures in other areas are turned off, in this way, the signal-to-noise ratio of fingerprint identification may be increased. Of course, the gate driving circuit as shown in FIG. 7 is only one implementation way for performing black-frame insertion on all the non-fingerprint-identification areas in the display area for realizing fingerprint identification, provided by the embodiment of the present disclosure, but the present disclosure is not limited to this, and the gate driving circuit may have other implementation ways capable of achieving the above-mentioned function.

Further, in the OLED display panel provided by the embodiment of the present disclosure, a single-side driving method may be adopted, as shown in FIG. 7, the gate driving circuit 300 is only disposed at one side. Of course, when the size of the panel is relatively large, in order to relieve signal distortion caused by loading, a double-side driving method may also be adopted, namely the gate driving circuit 300 is disposed at two sides, the limitations thereof are omitted herein.

During specific implementation, the OLED display panel provided by the embodiment of the present disclosure, as shown in FIG. 7, further includes a source driving circuit 400 configured to provide a power signal to the pixel circuit, during fingerprint identification, the light emitting control signal is transmitted to the pixel circuit electrically connected with the organic electroluminescent structures 01 in a row corresponding to the fingerprint identification area via the gate driving circuit 300, the power signal is transmitted to the pixel circuit in a column corresponding to the fingerprint identification area via the source driving circuit 400, so that only the organic electroluminescent structures in the fingerprint identification area emit lights during fingerprint identification.

Figure 9:
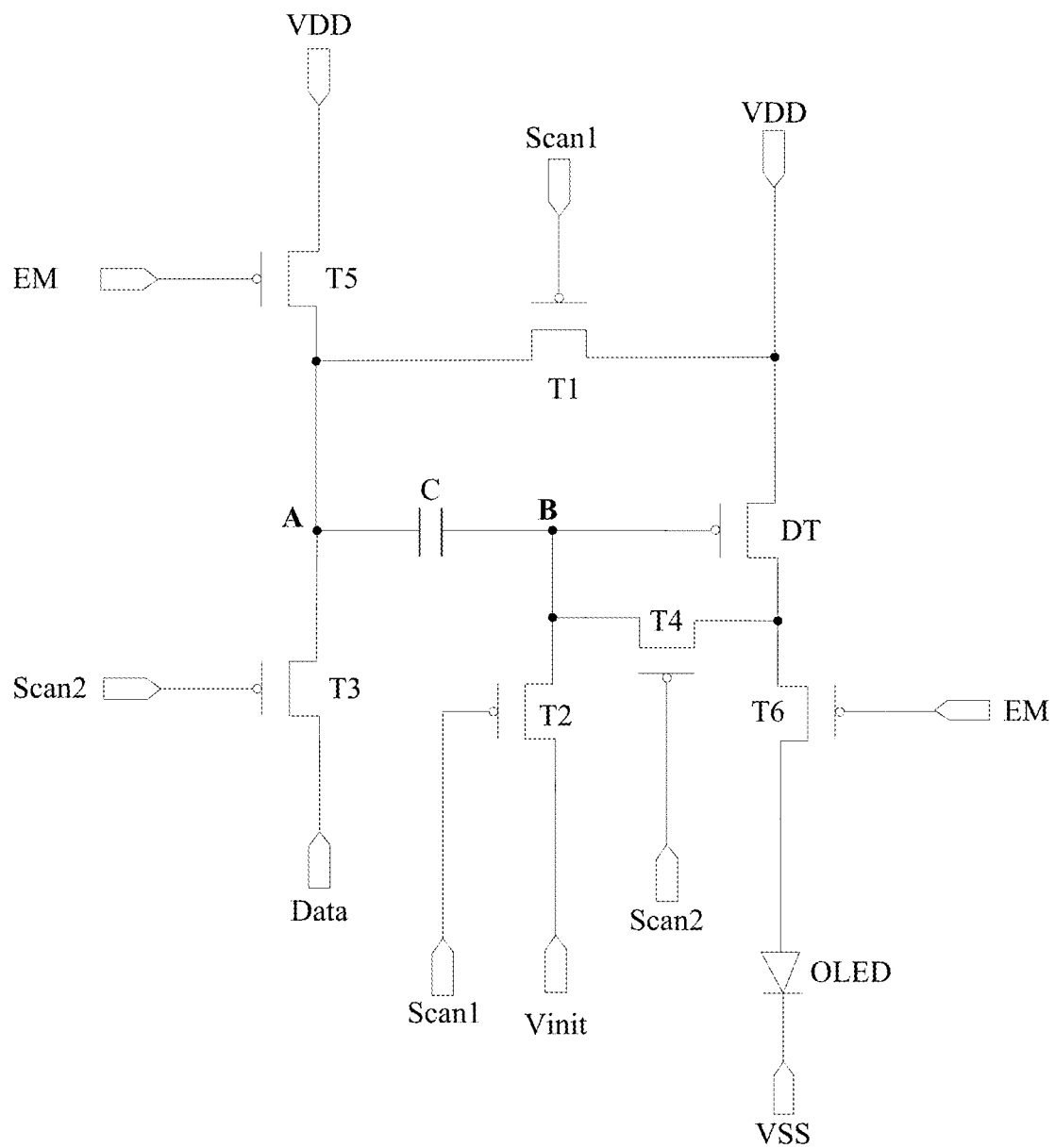
FIG. 9 is a schematic structural diagram of a pixel circuit provided by an embodiment of the present disclosure.

With the pixel circuit as shown in FIG. 9 as an example, when the light emitting control signal EM is at the low potential, the organic electroluminescent structures OLED emit lights under the driving of the power signal VDD. Therefore, the light emission of the organic electroluminescent structures OLED may be controlled by controlling the potential of the power signal VDD.

The following is described in detail in combination with a method for driving the OLED.

Based on the same inventive concept, an embodiment of the present disclosure further provides a driving method for driving any one of the above-mentioned OLED display panels, where display and fingerprint identification are driven in a time-sharing way within one period.

At a display stage, the organic electroluminescent structures are driven row by row to emit lights.

At a fingerprint identification stage, the organic electroluminescent structures in the fingerprint identification area are only driven to emit lights, and fingerprint identification is performed according to output signals of the photosensitive elements.

According to the driving method for the OLED provided by the embodiment of the present disclosure, during fingerprint identification, the organic electroluminescent structures in the fingerprint identification area are only driven to emit lights, and all the organic electroluminescent structures in a non-fingerprint identification area are black-frame-inserted, namely disturbance of lights in other areas is avoided, so that a function of fingerprint identification with a high signal-to-noise ratio is realized.

Optionally, at the fingerprint identification stage, all areas except the fingerprint identification area are black-frame-inserted. At the fingerprint identification stage, due to the black-frame insertion for all areas except the fingerprint identification area, influences on the detection of the photosensitive elements to the lights reflected by the finger when the lights emitted from other areas are also reflected to the photosensitive elements by other external objects may be avoided.

Figure 10:
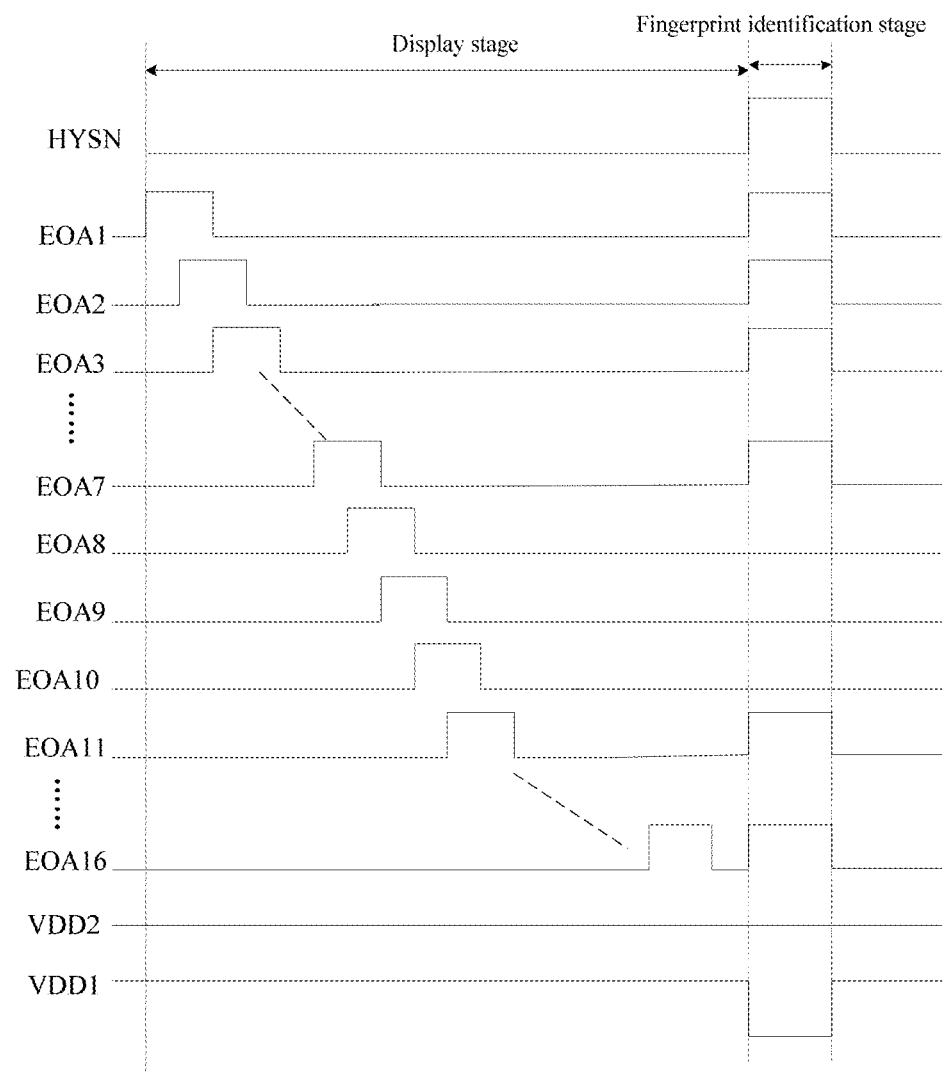
FIG. 10 is a driving sequence diagram of the OLED display panel provided by the embodiment of the present disclosure.

As shown in FIG. 7, with the fingerprint identification area A1 located in the middle of the display area A as an example, a time-sharing driving way is adopted, namely display and fingerprint identification are driven in a time-sharing way, the corresponding sequence diagram is shown as FIG. 10, and HYSN is sequence distribution for distinguishing the display stage and the fingerprint identification stage within one-frame time. At the display stage, the shift register elements EOA1-EOA16 sequentially output light emitting control signals, where the low potential denotes that the organic electroluminescent structures emit lights, and power signals VDD1 and VDD2 corresponding to the whole of the display area are both high-potential signals so as to drive the organic electroluminescent structures in the display area to emit lights. At the fingerprint identification stage, the potentials of light emitting control signals output by EOA1-EOA7 and EOA11-EOA16 are changed into high potentials, and all the organic electroluminescent structures in the corresponding row are blacklisted; and for the organic electroluminescent structures controlled by EOA8-EOA10, the power signal VDD1 corresponding to areas P1 and P2 is directly pulled lower, and the power signal VDD2 corresponding to the area A1 is still at the high potential, so that the organic electroluminescent structures in the areas P1 and P2 are turned off, and the organic electroluminescent structures in the fingerprint identification area are only retained to emit lights.

Optionally, in the OLED display panel provided by the embodiment of the present disclosure, at the fingerprint identification stage, the organic electroluminescent structures, emitting green lights, in the fingerprint identification area are only driven to emit lights. The brightness of the green organic electroluminescent structures is the highest, so that the uniformity may be met while the brightness is guaranteed, and furthermore, the signal-to-noise ratio is further increased.

Based on the same inventive concept, an embodiment of the present disclosure further provides a display device including any one of the above-mentioned OLED display panels provided by the embodiments of the present disclosure. The display device may be any one product or component with a display function, such as a mobile phone, a tablet personal computer, a television, a display, a notebook computer, a digital photo frame and a navigator. The implementation of the display device may refer to the embodiment of the above-mentioned OLED display panel, the descriptions thereof are omitted herein.

According to the above-mentioned OLED display panel, the driving method therefor and the display device provided by the embodiments of the present disclosure, the first light-blocking layer is disposed between each of the photosensitive elements and each of the organic electroluminescent structures, and the first light-blocking layer is at least provided with the hollow area corresponding to the fingerprint identification area. When a finger touches a screen, lights emitted by the organic electroluminescent structures are reflected by the finger to irradiate the photosensitive elements through small holes, such that fingerprint information of the finger is sensed due to brightness differences among the lights reflected by ridges and valleys of the finger. The small holes in the hollow area may function to improve the light intensity convergence, thus increasing the induction sensitivity to finger touching to the greatest extent.

Obviously, the skilled in the art can make various alterations and variations on the present disclosure without departing from the spirit and scope of the present disclosure. In this way, if these alterations and variations of the present disclosure fall within the scopes of the claims and the equivalent technologies of the present disclosure, the present disclosure is also intended to include the alterations and variations.

The invention claimed is:

1. An Organic Light-Emitting Diode (OLED) display panel, comprising:
    a display area, comprising a plurality of organic electroluminescent structures arranged in a matrix;
    a fingerprint identification area, located in the display area, wherein the fingerprint identification area comprises a plurality of photosensitive elements, and the photosensitive elements are located at backlight sides of the organic electroluminescent structures;
    the display panel further comprising: a first light-blocking layer, located between each of the photosensitive elements and each of the organic electroluminescent structures, wherein the first light-blocking layer is at least provided with a hollow area corresponding to the fingerprint identification area, wherein the hollow area of the first light-blocking layer comprises a plurality of via holes passing through the first light-blocking layer, and the via holes are located in an area corresponding to a gap among adjacent organic electroluminescent structures;
    wherein a pixel defining layer is further disposed between every two adjacent organic electroluminescent structures, and the pixel defining layer is provided with corresponding openings in positions corresponding to the via holes.

2. The OLED display panel of claim 1, wherein the first light-blocking layer is provided with a hollow area corresponding to the display area.

3. The OLED display panel of claim 1, wherein sizes of the via holes are smaller than or equal to those of the organic electroluminescent structures.

4. The OLED display panel of claim 3, wherein orthographic projections of the photosensitive elements on the first light-blocking layer cover an area where at least one of the via holes is located.

5. The OLED display panel of claim 1, wherein the display area is further provided with a pixel circuit electrically connected with the each of the organic electroluminescent structures; and
the first light-blocking layer is located between the pixel circuit and the each of the organic electroluminescent structures.

6. The OLED display panel of claim 5, wherein the organic electroluminescent structures comprise an anode layer;
the pixel circuit comprises a thin film transistor, wherein the thin film transistor comprises an active layer and a source and drain electrode layer located at a side, facing the first light-blocking layer, of the active layer; and
the first light-blocking layer is located between the source and drain electrode layer and the anode layer.

7. The OLED display panel of claim 5, further comprising a gate driving circuit, wherein
the gate driving circuit comprises a plurality of shift register elements corresponding to the organic electroluminescent structures in each row; the shift register elements are configured to provide a light emitting control signal to the pixel circuit electrically connected with the organic electroluminescent structures in a corresponding row; and
the shift register elements, corresponding to the organic electroluminescent structures in the fingerprint identification area, in the gate driving circuit are first shift register elements, and other shift register elements are second shift register elements; and each of the first shift register elements is electrically connected with a first power line, and each of the second shift register elements is electrically connected with a second power line.

8. The OLED display panel of claim 1, wherein the display area is further provided with a connecting electrode disposed on a same layer with the first light-blocking layer and insulated from the first light-blocking layer, and the pixel circuit is connected with the organic electroluminescent structures via the connecting electrode.

9. The OLED display panel of claim 1, wherein the display area is further provided with a second light-blocking layer disposed around the plurality of photosensitive elements.

10. The OLED display panel of claim 9, wherein the display area is further provided with a base substrate;
the organic electroluminescent structures and the first light-blocking layer are located at one side of the base substrate; and
the photosensitive elements and the second light-blocking layer are located at the other side of the base substrate.

11. The OLED display panel of claim 1, wherein the photosensitive elements comprise photodiodes.

12. The OLED display panel of claim 11, further comprising a signal reading element electrically connected with each of the photodiodes, wherein the signal reading element comprises a first transistor, a second transistor, a third transistor, a first capacitor, a second capacitor, an operational amplifier and a control switch;
a gate of the first transistor is electrically connected with a reset signal end, a first electrode of the first transistor is electrically connected with a common voltage signal end, and a second electrode of the first transistor is electrically connected with an end of the each of the photodiodes and a gate of the second transistor respectively;
a first electrode of the second transistor is electrically connected with a power voltage end, and a second electrode of the second transistor is electrically connected with a first electrode of the third transistor;
a gate of the third transistor is electrically connected with a control end, and a second electrode of the third transistor is electrically connected with a negative input end of the operational amplifier;
a positive input end of the operational amplifier is electrically connected with a reference signal end, and an output end of the operational amplifier is configured to read a signal; the first capacitor is electrically connected between the gate of the second transistor and the common voltage signal end;
the second capacitor is electrically connected between the negative input end and the output end of the operational amplifier; and
the control switch is connected in parallel at two ends of the second capacitor.

13. A display device, comprising the OLED display panel of claim 1.

14. A driving method for driving the OLED display panel of claim 1, wherein display and fingerprint identification are driven in a time-sharing way within one period, wherein,
at a display stage, the organic electroluminescent structures are driven row by row to emit lights; and
at a fingerprint identification stage, the organic electroluminescent structures in the fingerprint identification area are only driven to emit lights, and fingerprint identification is performed according to output signals of the photosensitive elements.

15. The driving method of claim 14, wherein at the fingerprint identification stage, the organic electroluminescent structures, emitting green lights, in the fingerprint identification area are only driven to emit lights.

16. The driving method of claim 15, wherein at the fingerprint identification stage, all areas except the fingerprint identification area are black-frame-inserted.

* * * * *